United States Patent
Black et al.

(10) Patent No.: US 8,349,144 B2
(45) Date of Patent: Jan. 8, 2013

(54) METHODS OF SPUTTERING USING A NON-BONDED SEMICONDUCTING TARGET

(75) Inventors: Russell Weldon Black, Longmont, CO (US); Robert Dwayne Gossman, Aurora, CO (US); Patrick Lynch O'Keefe, Loveland, CO (US); Scott Daniel Feldman-Peabody, Golden, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 86 days.

(21) Appl. No.: 12/892,360

(22) Filed: Sep. 28, 2010

(65) Prior Publication Data

US 2012/0048726 A1 Mar. 1, 2012

(51) Int. Cl.
*C23C 14/34* (2006.01)
(52) U.S. Cl. ......... 204/192.12; 204/192.25; 204/192.26; 204/298.09; 204/298.12
(58) Field of Classification Search ............. 204/298.12, 204/298.09, 192.26, 192.12, 192.25; 136/260
See application file for complete search history.

(56) References Cited

U.S. PATENT DOCUMENTS

| | | | | |
|---|---|---|---|---|
| 4,200,510 A | * | 4/1980 | O'Connell et al. | 204/192.12 |
| 4,299,678 A | * | 11/1981 | Meckel | 204/192.2 |
| 4,485,000 A | * | 11/1984 | Kawaguchi et al. | 204/298.12 |
| 5,244,556 A | * | 9/1993 | Inoue | 204/192.12 |
| 5,334,251 A | | 8/1994 | Nashimoto | |
| 5,393,675 A | | 2/1995 | Compaan | |
| 5,415,756 A | * | 5/1995 | Wolfe et al. | 204/192.23 |
| 6,137,048 A | | 10/2000 | Wu et al. | |
| 6,974,976 B2 | | 12/2005 | Hollars | |
| 7,544,884 B2 | | 6/2009 | Hollars | |
| 2004/0063320 A1 | | 4/2004 | Hollars | |
| 2009/0145746 A1 | | 6/2009 | Hollars | |

FOREIGN PATENT DOCUMENTS

JP 2001059170 3/2001

\* cited by examiner

*Primary Examiner* — Rodney McDonald
(74) *Attorney, Agent, or Firm* — Dority & Manning, P.A.

(57) ABSTRACT

A sputtering cathode is generally provided. The sputtering cathode can include a semiconducting target (e.g., a cadmium sulfide target, a cadmium tin oxide target, etc.) defining a sputtering surface and a back surface opposite to the sputtering surface. A backing plate can be positioned facing the back surface of the target and non-bonded to the back surface of the target. A non-bonding attachment mechanism can removably hold the target within the sputtering cathode such that the back surface is facing the backing plate during sputtering.

19 Claims, 4 Drawing Sheets

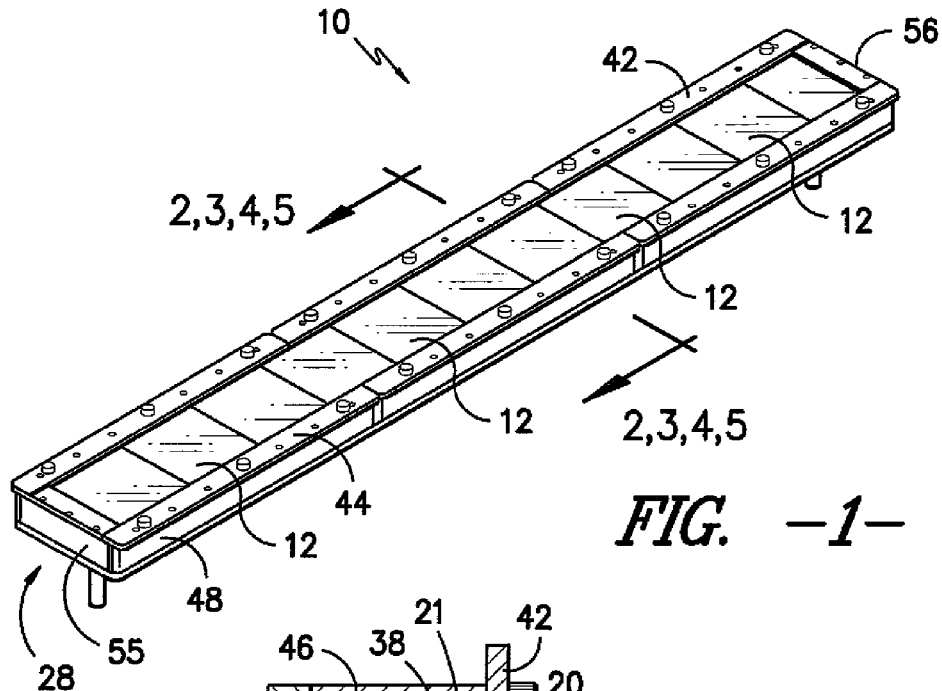
FIG. -1-
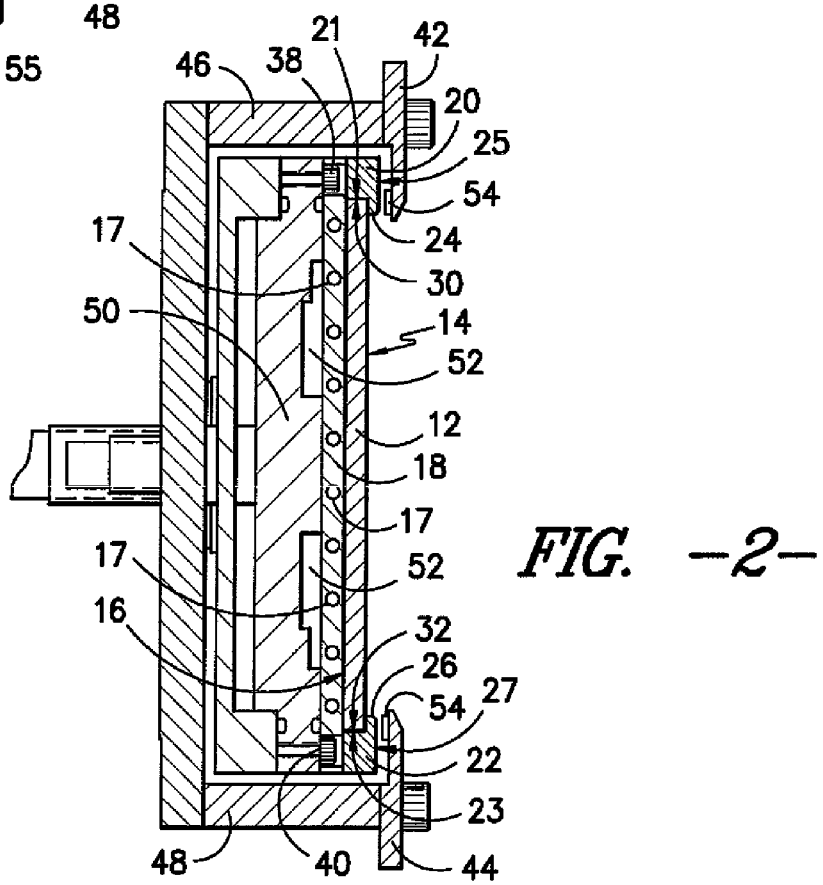
FIG. -2-

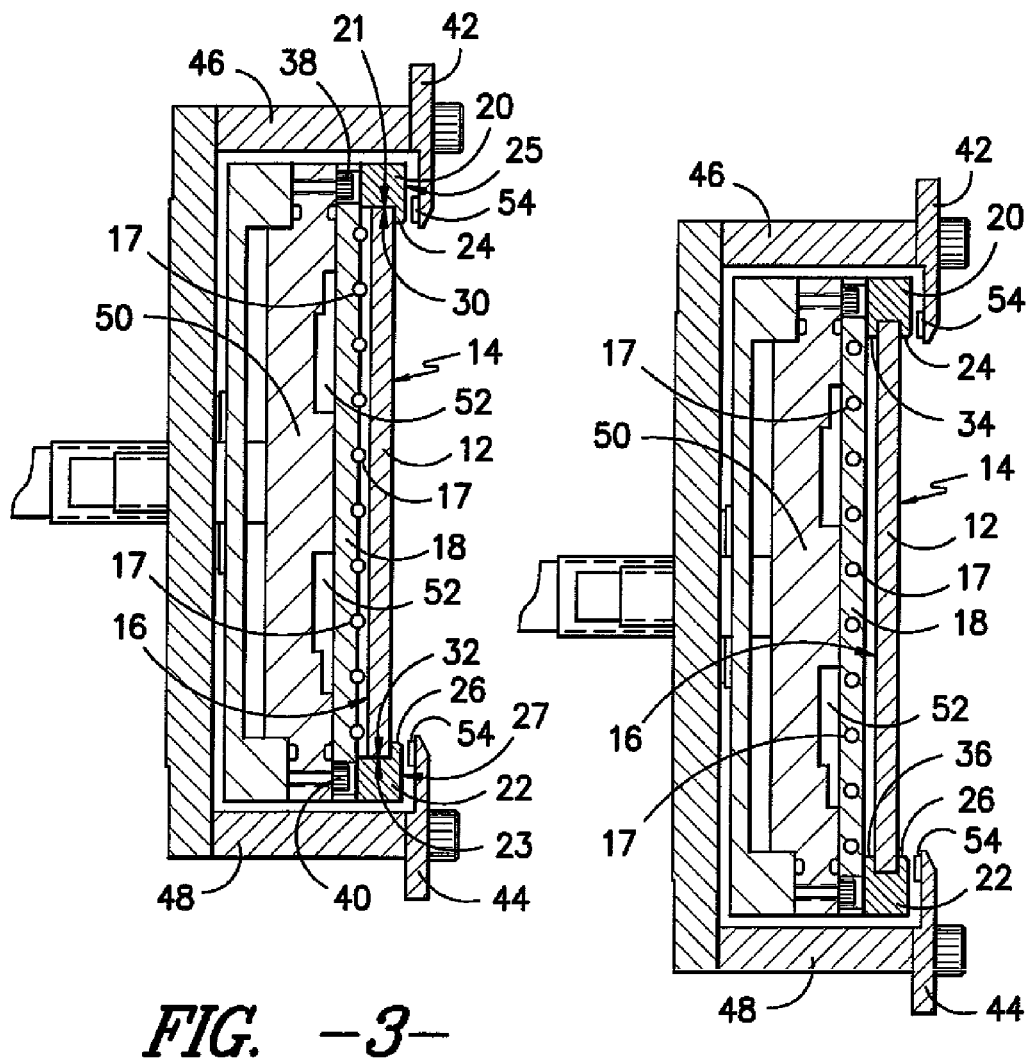
FIG. -3-
FIG. -4-

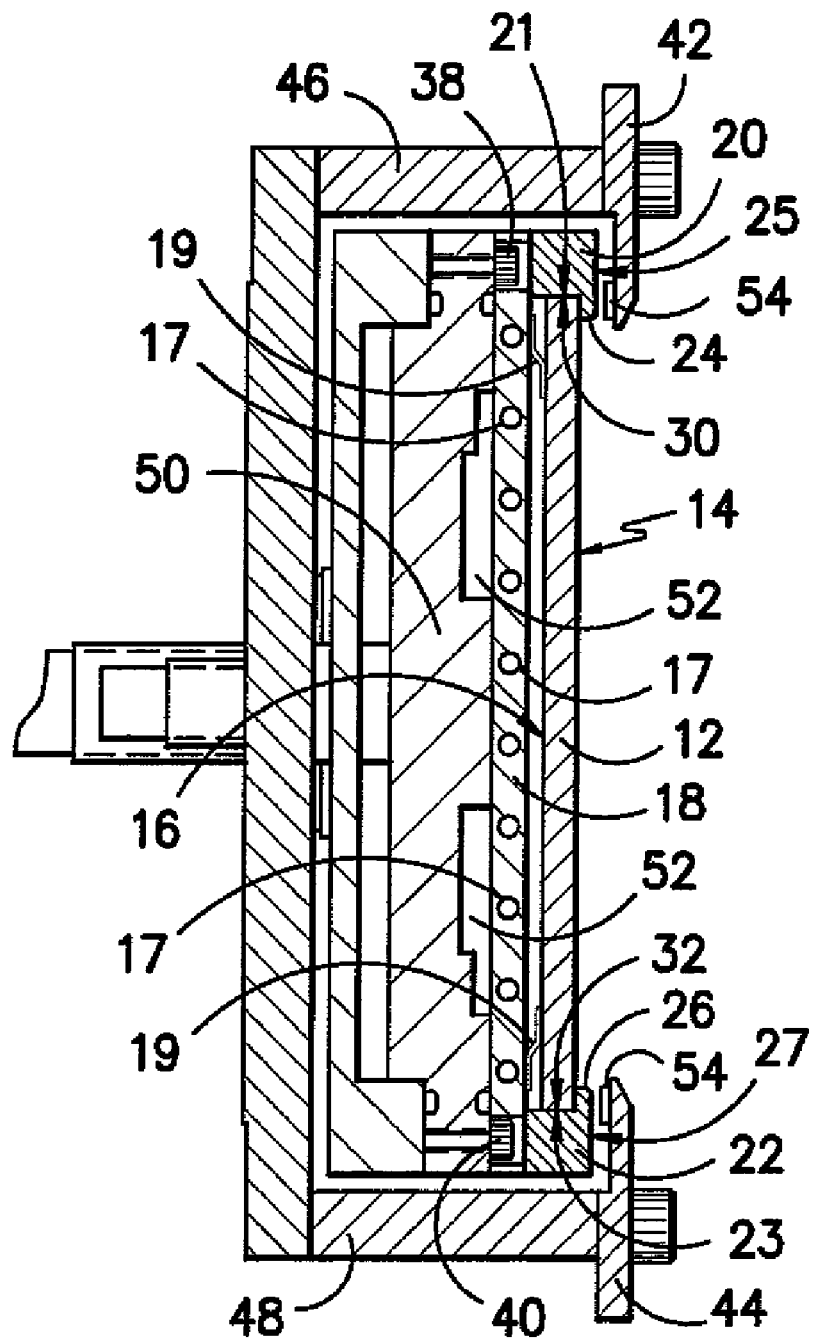
FIG. -5-

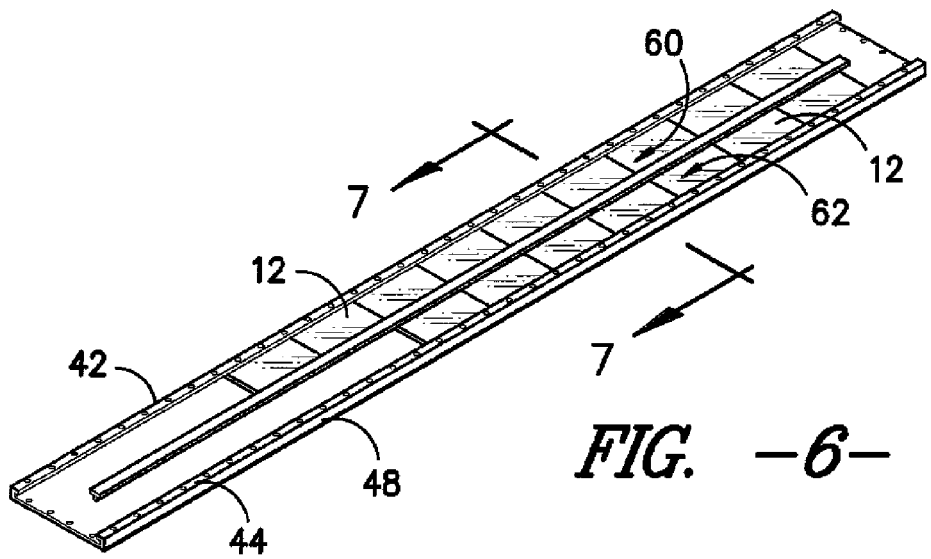
FIG. -6-
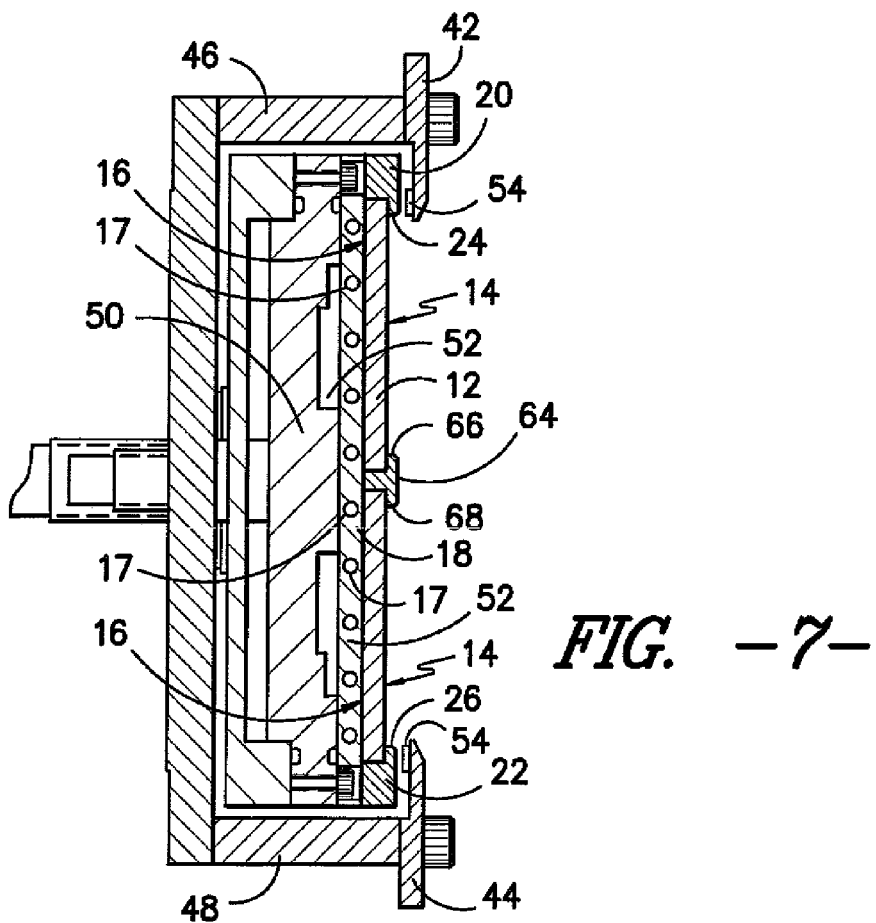
FIG. -7-

METHODS OF SPUTTERING USING A NON-BONDED SEMICONDUCTING TARGET

FIELD OF THE INVENTION

The subject matter disclosed herein relates generally to non-bonded, semiconducting targets and their use during sputtering of a semiconducting layer on a substrate. More particularly, the subject matter disclosed herein relates to the use of non-bonded cadmium sulfide targets for sputtering a cadmium sulfide layer during the manufacture of a cadmium telluride based thin film photovoltaic device.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials.

The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., a positive, electron accepting layer) and the CdS layer acts as a n-type layer (i.e., a negative, electron donating layer). Free carrier pairs are created by light energy and then separated by the p-n heterojunction to produce an electrical current.

The CdS layer, along with other layers (e.g., a transparent conductive oxide layer of cadmium tin oxide) can be formed via a sputtering process (also know as physical vapor deposition) where the source material is supplied from a semiconducting target (e.g., cadmium sulfide, cadmium tin oxide, etc.). Typically, the cadmium sulfide semiconducting target is bonded to a backing plate that is water cooled and then placed into magnetrons (cathodes) that perform the sputtering action. The semiconducting target is typically bonded to the backing plate using indium solder or a conductive epoxy. The bond provides good thermal and electrical contact between the semiconducting target and the water cooled backing plate. Thus, the heat created by the plasma on the opposite side of the semiconducting target can be dissipated and carried away from the target by the water cooled backing plate.

As the semiconducting target is sputtered, the semiconducting material is eroded from the target. As the semiconducting target erodes, nodules form on the surface of the target that, over time, may change the deposition rate during sputtering and could affect the characteristics of the resulting thin film. Additionally, these nodules can cause arcs to form in the sputtering chamber. These variables created after sputtering over an extended period can lead to thin film variances of the deposited semiconducting layers in a large-scale, manufacturing environment, such as during the commercial manufacture of cadmium telluride based thin film photovoltaic devices.

Thus, a need exists for a more uniform sputtering process for the deposition of substantially uniform layers.

BRIEF DESCRIPTION OF THE INVENTION

Aspects and advantages of the invention will be set forth in part in the following description, or may be obvious from the description, or may be learned through practice of the invention.

Methods of sputtering a non-bonded semiconducting target are generally provided. For instance, the method can include removably inserting a semiconducting target into a sputtering cathode to expose a sputtering surface of the semiconducting target, and contacting the sputtering surface with a plasma such that the semiconducting target increases in temperature upon initial contact with the plasma. The method can also include heating the semiconducting target to a sputtering temperature via heating elements positioned within the sputtering cathode prior to contacting the sputtering surface with the plasma. In all of the methods, the sputtering cathode comprises a backing plate such that the semiconducting target is positioned adjacent to a backing plate and non-bonded thereto.

Methods are also provided for replacing a depleted non-bonded semiconducting target from a sputtering cathode. An end bracket can be removed from a slide track of the sputtering cathode to provide an open end of the slide track. The slide track is defined between a backing plate, a first bracket, and a second bracket. Then, the depleted non-bonded semiconducting target can be removed out of the open end of the slide track, and a replacement non-bonded semiconducting target can be inserted into the slide track via the open end. Finally, the end bracket can be reattached onto the sputtering cathode.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 shows a perspective view of an exemplary sputtering cathode including a plurality of non-bonded semiconducting targets;

FIG. 2 shows a cross-sectional view of one embodiment of the exemplary sputtering cathode of FIG. 1;

FIG. 3 shows a cross-sectional view of another embodiment of the exemplary sputtering cathode of FIG. 1;

FIG. 4 shows a cross-sectional view of yet another embodiment of the exemplary sputtering cathode of FIG. 1;

FIG. 5 shows a cross-sectional view of yet another embodiment of the exemplary sputtering cathode of FIG. 1;

FIG. 6 shows a perspective view of another exemplary sputtering cathode including a plurality of non-bonded semiconducting targets in a multi-track configuration; and, FIG. 7 shows a cross-sectional view of one embodiment of the exemplary sputtering cathode of FIG. 6.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Non-bonded semiconducting targets are generally provided, along with sputtering cathodes incorporating such non-bonded targets. The non-bonded target can present several distinct advantages over their bonded counterparts. For example, the non-bonded target can be sputtered with a reduction, or substantial elimination, of nodules formed in the target's sputtering surface. Thus, the non-bonded target can be more uniformly sputtered during the deposition process and can lead to the formation of more uniform thin film layers (e.g., cadmium sulfide thin film layers, cadmium tin oxide layers, etc.), both on a single substrate and throughout the manufacturing process (i.e., from substrate to substrate).

FIG. 1 shows an exemplary sputtering cathode 10 including a plurality of non-bonded targets 12. Each of the targets 12 define a sputtering surface 14 and a back surface 16 that is opposite the sputtering surface 14. The back surface 16 of each target remains non-bonded to the backing plate 18, which is positioned within the sputtering cathode 10 and facing the back surface 16 of each target 12. As used herein, the term "non-bonded" refers to the target 12 being free from any attachment force between the back surface 16 of the target 12 and the backing plate 18 (i.e., no welding, solder, adhesive, or other attachment material is present between the back surface 16 of the target 12). As such, the target 12 can move freely with respect to the backing plate 18.

Since the targets 12 are not bonded to the backing plate 18, thermal conduction therebetween may be inhibited, particularly in the relatively low vacuum pressures of the sputtering atmosphere (e.g., about 1 mTorr to about 50 mTorr) present during sputtering. Thus, the targets 12 become hot due to the plasma in the sputtering chamber and/or a radiative heat source within the sputtering chamber. For any substantially constant sputtering process (i.e., with a substantially constant magnetron power, sputtering pressure, and/or sputtering temperature), the targets 12 can reach a relatively stable sputtering temperature when the thermal energy absorbed along the sputtering surface 14 is substantially equal to the thermal energy radiated from the back surface 16 of the target 12 to the backing plate 18. For example, the sputtering temperature of the target 12 can be about 100° C. to about 1,000° C. depending on the particular sputtering parameters utilized.

In one particular embodiment, the targets 12 can be preheated via heating elements 17 in or on the backing plate 18, prior to sputtering (e.g., prior to formation of the plasma field). For example, FIGS. 2, 4, and 5 show the heating elements 17 within the backing plate, while FIG. 3 shows the heating elements 17 on the backing plate's surface facing the targets 12. Thus, the targets 12 can be heated to the sputtering temperature, which can be substantially maintained during the entire sputtering process to provide uniform sputtering parameters. During sputtering of the targets 12, the sputtering temperature of the targets 12 can be maintained due to the plasma heating the targets 12 and/or the heating elements 17 (when present).

In one particular embodiment, temperature sensors 54 included on or within the within the sputtering cathode 10 to monitor the temperature of the sputtering surface 14 of the target 12. For example, the temperature sensor 54 can be a non-contact temperature sensor, such as a pyrometer. As shown, the temperature sensor 54 can be included within the sputtering cathode 10 on the back side of the shields 42, 44 to protect it from the plasma during sputtering. However, the temperature sensor 54 may be located in any suitable position within the sputtering chamber. Multiple temperature sensors 54 can be utilized to monitor the sputtering temperature of different areas of the sputtering surface 14 to ensure that a substantially constant temperature is maintained across the surface 14.

As the plasma heats the target 12 during sputtering, the amount of heat provided by the heating elements 17 can be decreased and/or even diminished all together. Thus, in one embodiment, the target 12 can maintain its sputtering temperature during sputtering due to the heat provided by the plasma without the need for the heating elements 17 to provide additional thermal energy to the targets 12. However, if the sputtering temperature decreases below the desired temperature, the heating elements 17 can provide additional thermal energy to the targets 12 to raise its sputtering temperature as desired.

These relatively high sputtering temperatures of the target 12 limits the material of the target 12 to those materials capable of withstanding these sputtering temperatures and any potential temperature gradients formed through the thickness of the target 12 without substantially cracking or melting. In one particular embodiment, the non-bonded targets can include cadmium sulfide to be used in methods for forming a cadmium sulfide layer via sputtering on a substrate, such as for use in cadmium telluride based thin film photovoltaic devices. When constructed of cadmium sulfide, the non-bonded cadmium sulfide target can also be sputtered at a lower power setting than typically required for an otherwise identical, but bonded target, while still achieving substantially the same deposition rate. Additionally, the non-bonded cadmium sulfide target can be easily interchanged upon depletion, resulting in significant time and cost savings. Alternatively, the material of the target 12 can include cadmium tin oxide, such as for forming a transparent conductive oxide layer on a substrate, such as for use in cadmium telluride based thin film photovoltaic devices.

The target 12 can be held on or adjacent to the backing plate 18 via brackets or other non-bonding attachment mechanism(s). FIGS. 2-4 show a first bracket 20 and a second bracket 22 positioned along opposite edges 21, 23 (i.e., first edge 21 and second edge 23), respectively of the targets 12. Both the first bracket 20 and the second bracket 22 define overhang flanges 24, 26 extending from their respective leading edges 25, 27. Thus, the first bracket 20 and the second bracket 22 form a slide track 28 for removably receiving targets 12 therebetween within the sputtering cathode 10. The slide track 28 is bordered by the inner surface of each overhang flange 24, 26 extending from the respective brackets 20, 22; the side edges 30, 32 of the first bracket 20 and the second bracket 22, respectively; and, the backing plate 18.

The first overhang flange 24 and the second overhang flange 26 extending from the first bracket 20 and the second bracket 22, respectively, are each positioned to overlap a portion the sputtering surface 14 along the respective edges (i.e., first edge 21 and second edge 23) of the target 12. The overlap portion of the sputtering surface 14 that each overhang flange 24, 26 covers is sufficient to hold the target 12 within the sputtering cathode and adjacent to the backing plate 18. However, the overlap portion of the sputtering surface 14 covered by the overhang flanges 24, 26 is preferably minimal, so as to avoid waste of the target material, since the overlap portion along the first edge 21 and second edge 23 of the target 12 will be inhibited from sputtering during the deposition process. For example, each overhang flange 24, 26 can cover about 0.5% to about 5% of the sputtering surface 14 extending from the first edge 21 and second edge 23 of the target 12, such as about 1% to about 4% of the sputtering surface 14.

The first bracket 20 and the second bracket 22 can hold and secure the target(s) 12 within the sputtering cathode 10 such that the back surface 16 is facing the backing plate 18 during sputtering. As such, the back surface 16 of the target 12 can be in close proximity to or in direct contact with the backing plate 18. Since the back surface 16 is non-bonded to the backing plate 18, however, the target is free to move with respect to the backing plate 18 within the confines of the slide track 28.

In one particular embodiment, the targets 12 can be sized to fit securely within the slide track 28, substantially allowing movement of the targets only along the length of the slide track 28. For example, the spacing between the opposite side edges 30, 32 of the first bracket 20 and the second bracket 22, respectively, can be about 100.1% to about 105% of the width of the target 12 defined between the first edge 21 and second edge 23, such as about 100.5% to about 104%, and particularly about 101% to about 103%. Likewise, the spacing between the overhang flanges 24, 26 and the backing plate 18 can be about 100.1% to about 110% of the thickness of the target 12 defined between the sputtering surface 14 and the back surface 16, such as about 100.5% to about 105%, and particularly about 101% to about 103%. Thus, 90% to about 99.8% of the sputtering surface 14 of the target 12 can remain exposed and available for sputtering, such as about 92% to about 99%, and particularly about 96% to about 98%.

The extra space in within the slide track 28 can allow for the targets 12 to move relatively easily when at room temperature (e.g., about 20° C. to about 25° C.) but will still secure the targets 12 from falling out when the cathode is mounted vertically or upside-down. For example, the extra space allows for thermal expansion of the target at elevated sputtering temperatures (e.g., about 100° C. or more) while preventing cracking of the target 12 as it is not mechanically restricted within its range of thermal expansion.

FIG. 2 shows one embodiment of the sputtering cathode 10 of FIG. 1 where the back surface 16 of the target 12 directly contacts the backing plate 18. In this embodiment, no other material is present between the back surface 16 and the backing plate 18. For instance, the spacing between the overhang flanges 24, 26 and the backing plate 18 can be about 100.1% to about 102% of the thickness of the target 12 defined between the sputtering surface 14 and the back surface 16, such as about 100.2% to about 101.5%, and particularly about 100.5% to about 101%. Thus, little room is available for the target 12 to move between the overhang flanges 24, 26 and the backing plate 18, particularly when the target 12 is heated causing expansion.

In one embodiment, a layer of dielectric material (e.g., cadmium sulfide) can be included on the surface of the backing plate 18 facing the target 12. This layer of dielectric material can prevent the backing plate 18 from being sputtered upon depletion of the target 12. In one embodiment, the layer of dielectric material can include substantially the same material as the target 12 (e.g., having substantially identical construction). For instance, both the layer of dielectric material and the target 12 can include cadmium sulfide.

FIG. 3 shows an alternative embodiment of the sputtering cathode 10 of FIG. 1 where a gap exists between the back surface 16 of the target 12 and the backing plate 18. In this embodiment, the target 12 is allowed a particular amount of float between the backing plate 18 and the overhang flanges 24, 26 of the first and second bracket 20, 22. For instance, the spacing between the overhang flanges 24, 26 and the backing plate 18 can be about 102% to about 105% of the thickness of the target 12 defined between the sputtering surface 14 and the back surface 16. This configuration can allow for the targets 12 to easily slide within the slide track 28 for relatively easy interchangeability.

In yet another alternative embodiment of the sputtering cathode 10, a spacer can be positioned between the back surface 16 of the target 12 and the backing plate 18 such that a gap exists between the back surface 16 and the backing plate 18. For example, FIG. 4 shows a first spacer 34 and a second spacer 36 connected to the first bracket 20 and the second bracket 22, respectively, between the back surface 16 of the target 12 and the backing plate 18. In the embodiment shown, the first and second spacers 34, 36 define second flanges extending from the side edges 30, 32 of the first bracket 20 and the second bracket 22, respectively, to prevent contact between the back surface 16 of the target 12 and the backing plate 18. The size of the first and second spacers 34, 36 can be controlled as desired, to control the distance between the back surface 16 and the backing plate 18.

The gap, when present between the back surface 16 of the target 12 and the backing plate 18, can be adjusted to control the equilibrium sputtering temperature of the target 12 during the sputtering process, which can lead to control of the deposition rate and/or deposition uniformity. The gap can be, in certain embodiments, about 100 µm to about 1 cm, such as about 200 µm to about 0.5 cm.

The spacing between the first and second brackets 20, 22 and the backing plate 18 can be adjusted as needed according to the thickness of the targets 12 and the desired amount of float to be present in the slide track 28. In the embodiments shown in FIGS. 2-4, for example, a pair of bolts 38, 40 are included to adjust the distance of the overhang flanges 24, 26 extending from the first bracket 20 and the second bracket 22, respectively, from the backing plate 18.

FIG. 5 shows an embodiment including a biasing member 19 located between the backing plate 18 and the target 12 to provide a force pushing the target 12 against the brackets 20, 22. Although shown as a fingerstock in FIG. 5, the biasing member 19 can be any configuration that biases the target 12 towards the brackets 20, 22, such as spring, etc. In one particular embodiment, the biasing member 19 is a fingerstock constructed from beryllium copper.

The first and second brackets 20, 22 can be, in one embodiment, constructed of a non-magnetic material so as to avoid any influence on the magnetic field formed during sputtering. For example, the first and second brackets 20, 22 can be formed non-magnetic metal material (e.g., stainless steel, such as 304 type stainless steel or 316 type stainless steel). In one particular embodiment, the exposed surfaces of the first and second brackets 20, 22 can be coated with cadmium, in the event that the brackets 20, 22 are sputtered during the deposition process. A layer of cadmium on the surface of the first and second brackets 20, 22 can prevent sputtering of the bracket's 20, 22 themselves, preventing contamination of the sputtering chamber (and the resulting deposited film).

The first and second brackets 20, 22 of the sputtering cathode 10 are shown in the embodiments of FIGS. 1-5 protected from the sputtering plasma by first and second dark space shields 42, 44, and from the rest of the sputtering chamber by side shields 46, 48. Thus, the material of the brackets 20, 22 are protected from sputtering so as to prevent contamination of the deposited thin film layer from the material of the brackets 20, 22.

The backing plate 18 can be connected to a cooling system. The embodiments of FIGS. 2-5 show that the backing plate is connected to a liquid cooling system that includes a cooling plate 50 and a liquid membrane 52. The liquid membrane 52 is configured to provide and carry a continuous flow of a cooling liquid (e.g., water) to the cooling system to remove heat from the backing plate 18 during heating and sputtering. The cooling plate 50 is provided to help collect thermal energy from the backing plate 18 and transfer that thermal energy to the liquid membrane 52.

In one particular embodiment, the targets 12 are rectangular so as to have substantially parallel sides. For example, the targets 12 shown in FIG. 1 are squares. This rectangular configuration can allow the targets 12 to readily form a substantially uniform sputtering surface across multiple targets within the sputtering cathode 10. Thus, gaps between adjacent targets 12 can be avoided, preventing sputtering of the underlying backing plate 18 during the sputtering process. Additionally, the rectangular configuration can allow the targets 12 to be readily changed and replaced utilizing the slide track 28.

Depleted targets 12, after being sputtered, can be readily changed by removing the first end bracket 55 and/or the second end bracket 56, allowing for the targets 12 to removed out of the slide track 28 by sliding the targets toward the opened end(s) following the length of the slide track 28. Then, replacement targets 12 can be inserted into the slide track 28 through the open end(s) to provide fresh source material for the sputtering process. The first end bracket 55 and the second end bracket 56 can be removably attached to the sputtering cathode 10 by any mechanism (e.g., bolted).

The embodiment of FIGS. 1-5 show a single track for the receipt of sputtering targets 12 in the exemplary sputtering cathode 10. However, in alternative embodiments, multiple tracks can be included in the sputtering cathode 10. For instance, the embodiment of FIG. 6 is similar to the design of FIG. 1, except that two tracks 60, 62 are included in the sputtering cathode 10. The tracks 60, 62 are substantially parallel to each other along the length of each track 60, 62 and are separated by a middle barrier 64 is positioned between the first track 60 and second track 62. The middle barrier 64 serves to hold the targets 12 within each track 60, 62 by defining a third overhang flange 66 and a fourth overhang flange 68. Specifically, the first track 60 is defined between the first overhang flange 26 of the first bracket 20 and the third overhang flange 66 of the middle barrier 64. Likewise, the second track 62 is defined between the second overhang flange 28 of the second bracket 22 and the fourth overhang flange 68 of the middle barrier 64.

The size of the middle bracket 64 can be controlled to expose the sputtering surface 14 the targets 12 in the areas that will be sputtered, particularly along the conventional, oval racetrack-like depletion zone seen during conventional magnetron sputtering. As such, the middle barrier 64 does not substantially impede the sputtering process and still provides source material for sputtering.

FIG. 7 shows one embodiment of the sputtering cathode 10 of FIG. 6 where the back surface 16 of the target 12 directly contacts the backing plate 18. However, the first and second brackets 20, 22 and the overhang flanges 66, 68 of the middle barrier 64 can be positioned and sized to provide a gap between the back surface 16 of the target 12 and the backing plate 18, such as shown in FIGS. 3-5 with respect to the single track embodiment of FIG. 1. For example, the dual track embodiment of FIG. 7 can include third and fourth spacers (not shown) extending from middle barrier 64 between the back surface 16 of the target 12 and the backing plate 18 to work with the first and second spacers (not shown) extending from the first and second brackets 20, 22 to create a gap between the back surface 16 of the target 12 and the backing plate 18 (similarly to those shown in FIG. 4 with respect to the single track embodiment of FIG. 1). Additionally, the dual track embodiment of FIG. 7 can include finger stock(s) biasing the targets 12 towards the first and second brackets 20, 22 and the overhang flanges 66, 68 of the middle barrier 64, as shown in FIG. 5.

The sputtering cathode 10 can be utilized with any sputtering process. Sputtering deposition generally involves ejecting material from the target, which is the material source, by contacting the target with a plasma. The ejected material can then be deposited onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere), and can have a relatively low sputtering pressure (e.g., about 1 mTorr and about 20 mTorr).

In one particular embodiment, the targets 12 include cadmium sulfide, such that the sputtering cathode 10 can be utilized to deposit a cadmium sulfide layer on a substrate. As stated, the non-bonded semiconducting target can be inserted into the sputtering cathode, optionally pre-heated to a sputtering temperature via heating elements, and thereafter, contacted with a plasma to eject atoms from the sputtering surface of the target. In certain embodiments, the sputtering temperature can be monitored throughout the heating and sputtering of the target (e.g., about 100° C. to about 1000° C.) via a temperature sensor positioned within the sputtering cathode, and adjusted as desired by increasing or decreasing the output of the heating elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of sputtering a plurality of non-bonded semiconducting targets, the method comprising:
   removably inserting a plurality of semiconducting targets into a slide track of a sputtering cathode to expose sputtering surfaces of the plurality of semiconducting targets, wherein the sputtering cathode comprises a backing plate such that the plurality of semiconducting targets is positioned adjacent to a backing plate and non-bonded thereto, and wherein a biasing member is positioned between the backing plate and the plurality of semiconducting targets to provide a force that pushes the plurality of semiconducting targets against brackets of the slide track;
   heating the plurality of semiconducting targets to a sputtering temperature via heating elements positioned within the sputtering cathode; and,
   contacting the sputtering surfaces of the plurality of semiconducting targets with a plasma such that atoms are ejected from the sputtering surfaces of the plurality of semiconducting targets.

2. The method of claim 1, wherein the sputtering temperature is about 100° C. to about 1,000° C.

3. The method of claim 1, further comprising:
   monitoring the sputtering temperature of the sputtering surfaces of the plurality of semiconducting targets.

4. The method of claim 3, wherein the sputtering temperature is monitored via a temperature sensor positioned within the sputtering cathode.

5. The method of claim 4, further comprising:
   adjusting the sputtering temperature of the sputtering surfaces of the plurality of semiconducting targets by increasing or decreasing the output of the heating elements.

6. The method of claim 1, wherein the plurality of semiconducting targets comprises cadmium sulfide.

7. A method of sputtering a plurality of non-bonded semiconducting targets, the method comprising:
   removably inserting a plurality of semiconducting targets into a slide track of a sputtering cathode to expose sputtering surfaces of the plurality of semiconducting targets, wherein the sputtering cathode comprises a backing plate such that the plurality of semiconducting targets is positioned adjacent to a backing plate and non-bonded thereto;
   inserting biasing members between the backing plate and the plurality of semiconducting targets to provide a force that pushes the plurality of semiconducting targets against brackets of the slide track; and,
   contacting the sputtering surfaces of the plurality of semiconducting targets with a plasma such that the plurality of semiconducting targets increases in temperature upon initial contact with the plasma.

8. The method of claim 7, further comprising:
   allowing the plurality of semiconducting targets to establish an equilibrium sputtering temperature during sputtering.

9. The method of claim 7, wherein the sputtering temperature is about 100° C. to about 1,000° C.

10. The method of claim 7, further comprising:
    monitoring the sputtering temperature of sputtering surfaces of the plurality of semiconducting targets.

11. The method of claim 10, wherein the sputtering temperature is monitored via a temperature sensor positioned within the sputtering cathode.

12. The method of claim 11, further comprising:
    adjusting the sputtering temperature of the sputtering surfaces of the plurality of semiconducting targets by increasing or decreasing the output of heating elements.

13. The method of claim 7, wherein the plurality of semiconducting targets comprises cadmium sulfide.

14. A method of replacing a depleted non-bonded semiconducting target from a sputtering cathode, the method comprising:
    removing an end bracket from a slide track of the sputtering cathode to provide an open end of the slide track, wherein the slide track is defined between a backing plate, a first bracket, and a second bracket;
    removing the depleted non-bonded semiconducting target out of the open end of the slide track;
    inserting a replacement non-bonded semiconducting target into the slide track via the open end; and,
    reattaching the end bracket onto the sputtering cathode.

15. The method of claim 14, wherein a plurality of depleted non-bonded semiconducting targets are removed out of the open end of the slide track, and wherein a plurality of replacement non-bonded semiconducting targets are inserted into the slide track via the open end.

16. The method of claim 14, wherein the sputtering cathode further comprises a second slide track positioned substantially parallel to the slide track.

17. The method of claim 16, further comprising:
    removing depleted non-bonded semiconducting targets from the second slide track.

18. The method of claim 14, wherein the replacement non-bonded semiconducting target comprises cadmium sulfide.

19. The method of claim 7, wherein the sputtering cathode is mounted vertically or mounted upside-down.

* * * * *